United States Patent [19]

Matsushita et al.

[11] 4,014,037
[45] Mar. 22, 1977

[54] SEMICONDUCTOR DEVICE

[75] Inventors: Takeshi Matsushita, Sagamihara; Hisao Hayashi, Atsugi; Teruaki Aoki, Tokyo; Hisayoshi Yamoto, Hatano; Yoshiyuki Kawada, Atsugi, all of Japan

[73] Assignee: Sony Corporation, Tokyo, Japan

[22] Filed: Mar. 24, 1975

[21] Appl. No.: 561,532

[30] Foreign Application Priority Data

Mar. 30, 1974 Japan ............................ 49-36175

[52] U.S. Cl. .................. 357/52; 357/54; 357/59
[51] Int. Cl.[2] ......................... H01L 29/34
[58] Field of Search ............. 357/34, 52, 54, 59, 357/53

[56] References Cited

UNITED STATES PATENTS

| | | | |
|---|---|---|---|
| 3,391,287 | 7/1968 | Kao et al. | 357/52 |
| 3,649,884 | 3/1972 | Haneta | 357/54 |
| 3,710,204 | 1/1973 | Batz | 357/34 |
| 3,755,721 | 8/1973 | Frohman-Bentchkowsky | 357/34 |
| 3,878,549 | 4/1975 | Yamazaki et al. | 357/54 |

FOREIGN PATENTS OR APPLICATIONS

| | | | |
|---|---|---|---|
| 47-31870 | 8/1972 | Japan | 357/59 |
| 300,472 | 4/1968 | Sweden | 357/53 |

OTHER PUBLICATIONS

W. Steinmaier et al., "Successive Growth of Si and $SiO_2$ in Epitaxial Apparatus," J. of Electro Chem. Soc., vol. III, No. 2, Feb. 1964, pp. 206–209.

*Primary Examiner*—Michael J. Lynch
*Assistant Examiner*—Joseph E. Clawson, Jr.
*Attorney, Agent, or Firm*—Hill, Gross, Simpson, Van Santen, Steadman, Chiara & Simpson

[57] ABSTRACT

A polycrystalline silicon layer as a passivation layer formed on a semiconductor single crystal layer in a semiconductor device and in which polycrystalline silicon layer contains 2 to 45 atomic percent of oxygen. This layer can be formed under accurate control by utilizing a mixed gas of nitrogen oxide as an oxygen supply source and a silicon compound as a silicon supply source is thermally decomposed. The polycrystalline silicon is constituted of grains comprising single crystals of silicon. Oxygen atoms are uniformly distributed in the grains. Substantially no $SiO_2$ layer exists between the grains and the semiconductor single crystal layer.

5 Claims, 9 Drawing Figures

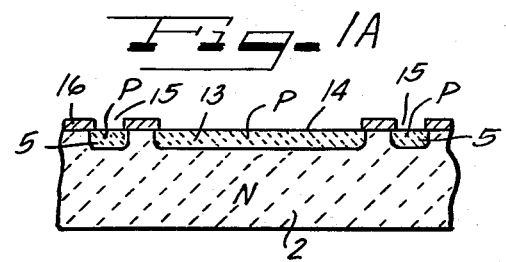
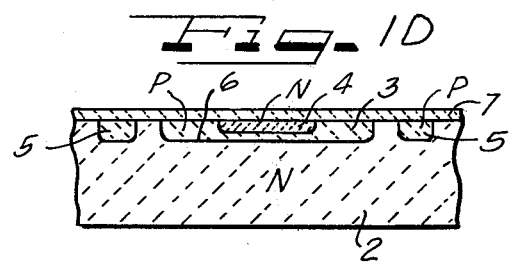
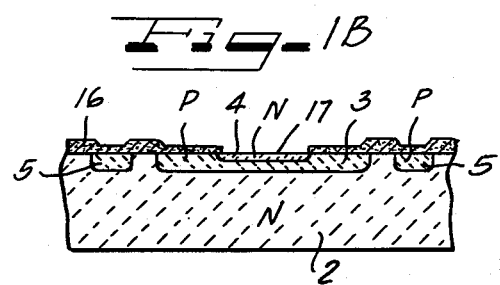
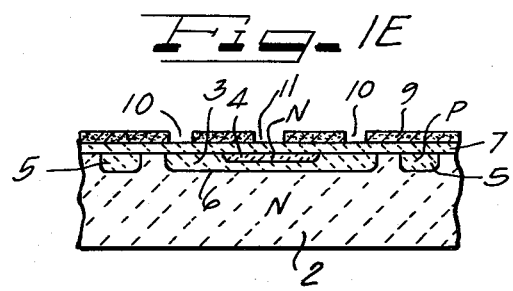
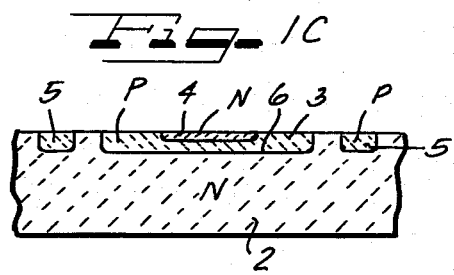
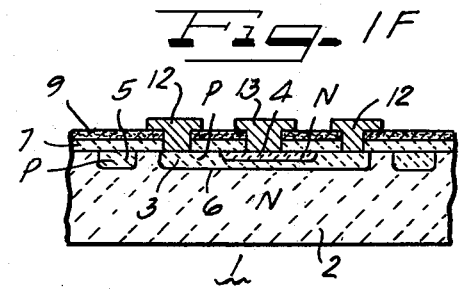
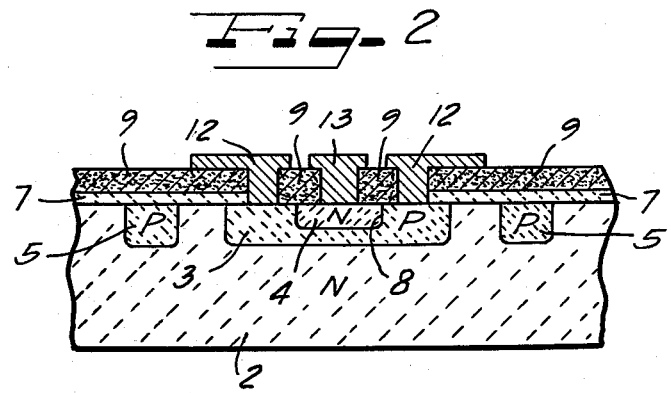

SEMICONDUCTOR DEVICE

BACKGROUND OF THE INVENTION

1. Field of the Invention

This invention relates to a semiconductor device, and more particularly to a semiconductor device provided with a surface passivation layer which is indispensable for the construction of diodes and transistors having high reliability.

2. Description of the Prior Art

The surface passivation layer is generally formed by the vapor growth method. Studies have been made on the material of the surface passivation layer in order to make semiconductor elements more passive and more stable.

For example, $SiO_2$ is most widely used as the material of the surface passivation layer. An $SiO_2$ layer is coated on the PN junction of the diode which is exposed at the surface of a silicon semiconductor substrate. However, in operation, an undesirable memory function is induced by the positive charge existing in the $SiO_2$ layer. A channel is formed in the P-type semiconductor substrate, due to the negative charge induced by the positive charge in the $SiO_2$ layer. Moreover, the positive and negative charges above mentioned are fixed due to the polarization in the shielding resin. As a result, the breakdown voltage of the PH junction is lowered, and the reliability is deteriorated by external electric fields. Accordingly, the $SiO_2$ layer has undesirable characteristics. Moreover, the surface of Si is apt to be distorted due to the difference between the coefficients of thermal expansion of the $SiO_2$ layer and the semiconductor substrate.

In order to remove the above-mentioned disadvantages, a laminated structure will be considered in which a polycrystalline silicon layer is coated on the PN junction of the diode exposed at the surface of the silicon semiconductor substrate and the $SiO_2$ layer is coated on the polycrystalline silicon layer. Since the resistance of the polycrystalline silicon layer is smaller than that of $SiO_2$, no electrical charge will be induced which is in contrast to the single layer structure of $SiO_2$ as mentioned above. Accordingly, the breakdown voltage of the PN junction can be raised. A high breakdown voltage is desired for integrated circuits. Moreover, the reliability can be improved. However, since the electrical charges in the semiconductor substrate can flow through the polycrystalline silicon layer, the laminated structure has the disadvantages that the reverse leakage current is increased, the $h_{FE}$ is lowered and the noise is increased.

SUMMARY OF THE INVENTION

An object of this invention is to provide a semiconductor device which has a passivation layer for obtaining passivation and stabilization.

Another object of this invention is to provide a semiconductor device which can increase the breakdown voltage of the PN junction, prevents the undesirable influences of external electrical fields, reduces reverse leakage currents, improves the noise-characteristic, and prevents thermal distortion.

A further object of this invention is to provide a semiconductor device suitable as a semiconductor element and integrated circuits, such as diodes, transistors and MOS capacitors which have the PN junction reverse-biased in operation.

A still further object of this invention is to provide a method by which a passivation layer having good characteristics can be simply formed under accurate and simple control.

In accordance with an aspect of this invention, a semiconductor device comprises a semiconductor single crystal layer, for example, a silicon semiconductor substrate and a polycrystalline silicon layer formed on the semiconductor single crystal layer, containing 2 to 45 atomic percent oxygen, preferably 14 to 35 atomic percent. In this specification, "atomic percent" is defined as $$\frac{y}{x+y}(100),$$

where in a molecule, $x$ is the number of silicon atoms and $y$ is the number of oxygen atoms. By such an arrangement, the breakdown voltage of the junction can be greatly increased and the influence of external electrical field can be eliminated. The reliability can also be substantially improved. The reverse leakage current can also be greatly reduced. The noise characteristic can also be greatly improved and, moreover, thermal distortion can be prevented.

It is preferable that the mean grain size of the polycrystalline silicon be under 1000 A, for example, in the range between 100 to 1000 A, and that the polycrystalline silicon contain grains having a size under 1000 A, for example, in the range between 100 to 1000 A. Substantially, no $SiO_2$ will exist between the silicon semiconductor substrate and the polycrystalline silicon layer.

The foregoing and other objects, features and advantages of the invention will be apparent from the following more particular descriptions of preferred embodiments of the invention, as illustrated in the accompanying drawings.

BRIEF DESCRIPTION OF THE DRAWINGS

FIGS. 1A to 1F illustrate the sequence of steps involved in the manufacture of a transistor device according to this invention;

FIG. 2 is a cross-sectional view of a transistor according to one embodiment of this invention;

DESCRIPTION OF THE PREFERRED EMBODIMENTS

Figures 3, 4:
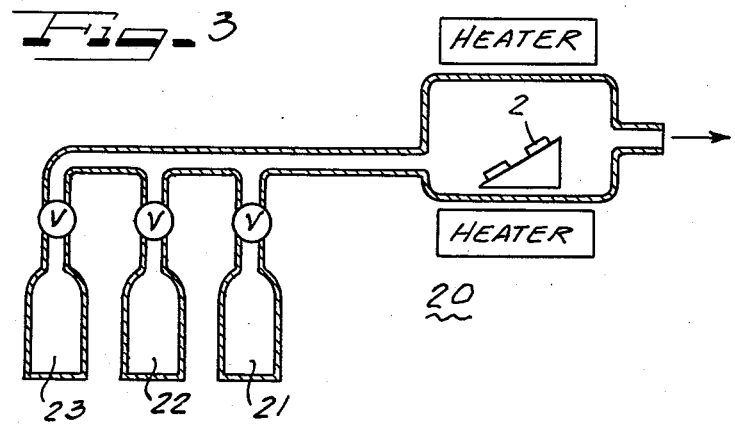
FIG. 3 is a sketch of a Chemical Vapor Deposition Apparatus used in this invention.
FIG. 4 is a graph indicating the results of tests for various transistors which have passivation layers and is a plot of $I_{CBO}$ vs. $V_{CB}$.

One embodiment of this invention as applied to a transistor will be described with reference to the drawings.

First, a method for manufacturing the transistor 1, will be described with reference to FIGS. 1A to 1F.

A semiconductor substrate 2 having an N-type silicon with lower concentration of impurity or an N-type semiconductor substrate with a higher concentration and having an N-type semiconductive region with a lower concentration of impurity, epitaxially grown on the N-type semiconductor substrate can be used. A $SiO_2$ layer 16 is formed on the semiconductor substrate 2 by a conventional thermal oxidation method or by the vapor growth method. Openings 14, 15 are formed in the $SiO_2$ layer. P-type impurities are diffused into the semiconductor substrate 2 through these openings to form a P-type semiconductive region 3 as a base region and a P-type semiconductive region 5 as a guard ring therein. During the diffusion operation, $SiO_2$ layers are formed in the openings by thermal oxidation. As shown in FIG. 1B, opening 17 is formed in the $SiO_2$ layer 5 overlying the P-type semiconductive region 3. N-type impurities are diffused into the P-type semiconductive region 3 to form the N-type semiconductive region 4 therein.

As shown in FIG. 1C, the $SiO_2$ layer is removed from the semiconductor substrate 2 by an etching operation. Polycrystalline silicon and a small quantity of oxygen atoms are coated on the exposed semiconductor substrate 2 to form the polycrystalline silicon layer 7 containing oxygen.

As shown in FIG. 1D, polycrystalline silicon layer 7 having a predetermined thickness is formed on the semiconductor substrate 2 by the below-mentioned vapor growth method so as to cover the exposed part of the PN-junction 6. The thickness of the polycrystalline silicon layer 7 is preferably in the range of 1000 A to $2\mu$. A better passivation effect can be obtained for thicknesses over 5000 A. However, with thicknesses over $2\mu$, the corners of the electrodes are more apt to be broken. The polycrystalline silicon layer 7 contains oxygen in the range of 2 to 45 atomic percent. From the view point of passivation, it is preferable that the thickness of the polycrystalline silicon layer 7 be as large as possible. The polycrystalline silicon layer 7 is so wide as to cover the exposed part of the PN junction 6 and the extended area of the depletion layer formed when the PN junction 6 is reverse-biased. As shown in FIG. 1E, $SiO_2$ layers 9 are formed on the polycrystalline silicon layer 7, by the vapor growth method. Openings 10 and 11 are formed in the $SiO_2$ layers 9 by the conventional photo-etching method. The openings 10 and 11 are filled with a base electrode 12 and an emitter electrode 13, as shown in FIG. 1F.

Since the $SiO_2$ layer 9 is formed as an oxide on the polycrystalline silicon layer 7, the water-resisting property can be improved as compared with the case where the polycrystalline silicon layer 7 is exposed in a semiconductor device. Since a double layer is formed by the polycrystalline silicon layer containing oxygen and the $SiO_2$ layer, a semiconductor device is not affected by electrical charges existing in the $SiO_2$ layer, in contrast with the conventional semiconductor device. The reason for this is believed to be that the electrical charges can be trapped in a polycrystalline layer and can also pass through the polycrystalline silicon layer 7 containing oxygen which is interposed between the $SiO_2$ layer 9 and the semiconductor substrate 2.

A p-type semiconductive region 5 which serves as a guard ring is formed around the P-type semiconductive region 3 by the diffusion method. A depletion layer is formed adjacent to a PN junction 6 between the P-type semiconductive region 3 and the semiconductor substrate 2 when a reverse bias voltage is applied to the PN-junction 6. The P-type semiconductive region 5 is so far from the P-type semiconductive region 3 that the depletion layer thus formed can extend to the P-type semiconductive region 5. The combination of such an arrangement and the polycrystalline silicon layer, results in the breakdown voltage of the PN-junction 6 being greatly raised.

Another embodiment is shown in FIG. 2. In FIG. 2, the PN junction 8 is directly covered by $SiO_2$ layer 9. The reason the $SiO_2$ layer 9 is coated directly onto the exposed part of the PN-junction 8, is that $h_{FE}$ can be increased during forward bias of the PN junction 8.

In the above-mentioned embodiments, an intermediate layer having good moisture-resistivity, as for example, an aluminum layer, may be formed between the polycrystalline silicon layer and the $SiO_2$ layer.

The formation of the polycrystalline silicon layer 7 will be described with reference to FIG. 3. A mixed gas of mono-silane $SiH_4$ from tank 21 and dinitrogen monoxide $N_2O$ from tank 22 are fed through suitable valves into the vapor growth apparatus 20 which contains the semiconductor substrates 2. $N_2$ gas from tank 23 which serves as a carrier gas is fed through the apparatus at a constant flow rate of 25 l/min. and the mono-silane $SiH_4$ is fed into the apparatus at a constant flow rate of 30 cm$^3$/min. The flow rate of the $N_2O$ is varied at rates of 0, 10, 20, 30, 150, 300 and 1200 cm$^3$/min.

The semiconductor substrate is heated in the temperature range of 600° to 750° C, as for example, 650° C for the growth of the layer in the apparatus. Since the growing temperature is relatively low, there is little possibility that impurities in the semiconductor substrate will be doped into the polycrystalline silicon layer 7.

For temperatures below 600° C, the growth rate is too slow for practical manufacturing. Also at temperatures above about 800° C, the growth rate is too high and control of the thickness of the polycrystalline silicon layer 7 is very difficult and also the grain size becomes too large for the desirable characteristics.

Polycrystalline silicon is deposited onto the semiconductor substrate by the thermal decomposition of mono-silane. At the same time, oxygen derived from $N_2O$ is nearly uniformly mixed into the polycrystalline silicon. Thus, as many as seven different polycrystalline silicon layers 7 containing different amounts of oxygen can be formed on the semiconductor substrates 2, corresponding to the seven different flow rates of 0, 10, 20, 30, 150, 300 and 1200 cm$^3$/min. of the $N_2O$ gas. Then the $SiO_2$ layers 9 are formed on the polycrystalline silicon layers 7.

The relationship between the concentration of oxygen and the flow ratio of $N_2O$ to $SiH_4$ is shown on Table 1, and as follows:

TABLE 1

| Ratio of $N_2O/SiH_4$ | Concentration of Oxygen (atomic %) |
|---|---|
| 0 | 0 to 1.0 |
| ⅓ | 26.8 |
| ⅔ | 34.8 |
| 1 | 36.4 |
| 5 | 48.6 |
| 10 | 54.7 |
| 40 | 66.1 |

The above rates of $N_2O$ correspond respectively to flow rates of 0, 10, 20, 30, 150, 300 and 1200 cm$^3$/min.

The above results were obtained with an X-ray microanalyzer having a 10 KV acceleration voltage and a $1\mu$ beam diameter. The concentration of atomic percent oxygen increases as the logarithm of the ratio of $N_2O/SiH_4$. Oxygen was uniformly distributed in all of the polycrystalline silicon layers 7 and was not isolated. The growth rate of the polycrystalline silicon became lower with an increase of the flow rate of $N_2O$ and with a decrease in the growing temperature.

For polycrystalline silicon layers containing oxygen with concentrations less than 2 atomic percent, gradually the property of pure polycrystalline silicon layer was approached. The reverse current flowing through the polycrystalline silicon layer containing oxygen with a concentration less than 2 atomic percent gradually approached that of a pure polycrystalline silicon layer. Polycrystalline silicon layers containing oxygen at concentrations over 45 atomic percent displayed instability as great as the $SiO_2$ layer. Accordingly, the invention requires that the concentration of oxygen be in the range of 2 to 45 atomic percent. From the view point of the below-mentioned properties, particularly the reliability, it is preferable that the concentration of oxygen be in the range of 14 to 35 atomic percent, namely that the ratio of the $N_2O/SiH_4$ be in the range from 1/6 to 1/3.

The electron diffraction measurements showed that the grain size of the crystal in the polycrystalline silicon layer 7 was about 500 A. The grain size of the pure polycrystalline silicon ranges from 2 or 3 $\mu$ near to the grain size of amorphous substance, depending on the growth condition. The polycrystalline silicon tends to be more amorphous with an increase of the concentration of oxygen. It is preferable that the mean grain size be under 1000 A, for example, in the range 100 to 1000 A. It is preferable that the polycrystalline silicon layer contains silicon crystals having grain sizes under 1000 A, for example, in the range of 100 to 1000 A as much as possible.

In the infrared absorption measurement, an absorption peak at a wave length of 9.0 $\mu$ and a wide absorption peak at the wave lengths ranging from 9.3 to 10.0 $\mu$ were observed in overlapped form. A single crystal of silicon containing oxygen absorbs infrared rays having wave lengths of 9.0 $\mu$, absorbs infrared rays having wave lengths of 9.3 $\mu$, and SiO absorbs infrared rays having wave lengths of 10.0 $\mu$. The wide absorption peak at the wave lengths ranging from 9.3 to 10.0 $\mu$ was shifted from 9.7 $\mu$ (for $N_2O/SiH_4 = 1/3$) to 9.4 $\mu$ (for $N_2O/SiO_4 = 10$) with the increase of the concentration of oxygen. With the heat treatment at 1100° C for 30 minutes, the wide absorption peak was sharpened and shifted toward the side having short wave lengths. Thus, the wide absorption peak disappeared. A single absorption peak was observed at the wave length of 9.0 $\mu$ for a ratio of $N_2O/SiH_4 = 1/3 - 1$. With the further increase of $N_2O$, the absorption peaks at the wave lengths of 9.0 $\mu$ and 9.3 $\mu$ were observed to be in overlapped form.

It is to be inferred from the above-mentioned facts that sufficient oxygen penetrates into the grains of the polycrystalline silicon and that an intermediate compound between $SiO_2$ and SiO exists around the grains. Moreover, it is seen from the above-mentioned facts that the penetration of oxygen into the polycrystalline silicon can be promoted by the heat treatment when the concentration of oxygen is lower. The measurements of visible radiation absorption and ultraviolet ray absorption showed that the absorption edge where the transmissivity is zero, was shifted to the side of the shorter wave length with an increase of the concentration of oxygen. It is inferred from this fact that the polycrystalline silicon layer 7 is not a mere mixture of Si and $SiO_2$, but that oxygen is nearly uniformly distributed throughout the polycrystalline silicon.

The refractive index was measured by an ellipsometer. The refractive index of pure polycrystalline silicon ($N_2O/SiH_4 = 0$) was about 4, and that of $SiO_2$ ($N_2O/SiH_4 > 40$) was about 1.45, where the concentration of oxygen was 66.7 atomic percent. It was found that the refractive index of the polycrystalline silicon gradually decreased with an increase of the concentration of oxygen in the range from about 4 to about 1.45. The polycrystalline silicon layer 7 became similar to the $SiO_2$ layer at concentrations of oxygen over 45 atomic percent. Accordingly, it is not desirable that the concentration of oxygen be over 45 atomic percent. This is also observed from the fact that the resistivity increases with the concentration of oxygen. For example, the resistivity of the polycrystalline silicon layer 7 is about $3 \times 10^8 - 1 \times 10^{11}$ $\Omega$ cm for ratios of $N_2O/SiH_4$ between 1/8 to 1. This is between the resistivity of pure polycrystalline silicon ($3 \times 10^6$ $\Omega$ cm) and that of $Si_3N_4$.

Next, the electrical characteristics of the transistor 1 as above-constructed will be described.

Breakdown Voltage

The breakdown voltage is the highest at an atomic percent of oxygen = 0. It tends to decrease with the increase of oxygen. Breakdown voltages are about 500V at atomic percentages of oxygen of 27.5, 32.5, 36.5. But breakdown voltages are down 20% or about 400V at atomic percentages of oxygen of 47.5, 55. Also, the breakdown voltage is about 400V utilizing $SiO_2$ as the passivation layer.

Reverse Leakage Current

A reverse bias voltage $V_{CB}$ was applied to the PN-junction 6 between the collector and the base to measure reverse leakage currents $I_{CBO}$ flowing through the collector and the base and FIG. 4 illustrates the experimental results obtained. It is seen from this data that the reverse leakage current $I_{CBO}$ was greatly reduced when the polycrystalline silicon containing oxygen was used as compared to the case when pure polycrystalline silicon was used. $I_{CBO}$ is the largest at atomic percent of oxygen = 0. It was very small in the range where the atomic percent of oxygen was 14 to 36.5.

For example, when pure polycrystalline silicon was used, or when the concentration of oxygen was under 2 atomic percent, $I_{CBO}$ was 0.35 $\mu$ A, at $V_{CB} = 350V$. But when the concentration of oxygen was over 2 atomic percent, especially more than 14 atomic percent, $I_{CBO}$ was 0.01 $\mu$ A below $V_{CB}$ of 500 volts and was nearly unchanged in the range less than the breakdown voltage.

The reason $I_{CBO}$ was reduced, is considered to be that the mobility of carriers in the polycrystalline silicon is reduced due to the predetermined content of oxygen, or that the resistance of the polycrystalline silicon containing oxygen in predetermined quantity is far higher than that of pure polycrystalline silicon.

The resistance becomes large at atomic percent of oxygen $\geq$ 48.6, because the characteristics of this polycrystalline layer is the same as $SiO_2$ and an undesirable memory function is induced by positive charges existing in $SiO_2$. This causes an inversion layer or an accumulation layer form at the surface of the substrate.

Stability of Amplification Factor

The amplification $h_{FE}$ was the smallest at atomic percent of oxygen = 0, and the largest at atomic percent of oxygen in the range between 48.6 to 66.1. It was intermediate between the smallest and the largest atomic percent of oxygen in the range between 26.8 to 36.4. It was increased by using hydrogen-annealing at 400° C. The increase was smaller for the transistor 1 than it was for conventional transistors using only a SiO₂ layer. Accordingly, the transistor 1 has superior $h_{FE}$ stability.

Stability Against External Electric Field

At concentrations of oxygen between 2 to 45 atomic percent, oxygen atoms are nearly uniformly distributed in the grains of the polycrystalline silicon. At concentrations of oxygen over 45 atomic percent, the grains are enveloped in SiO₂. As a result, the grains function as floating electrodes. For this reason, electrical charges are apt to be trapped in silicon grains when an external voltage is applied. The characteristic of the surface of the polycrystalline silicon layer becomes unstable. As a result, the breakdown voltage or the function as an insulating layer for the semiconductor substrate is lowered.

The SiO₂ layer with a thickness of 2000 A is formed on a polycrystalline silicon layer with a thickness of 5000 A and a voltage $V_G$ is applied between the SiO₂ layer and the semiconductor substrate. In a normal MOS structure, a C – V characteristic curve has an S-shape. However, when the polycrystalline silicon layer lies between the SiO₂ layer and the semiconductor substrate, the capacitance C is almost unchanged. The boundary surface between the semiconductor substrate and the polycrystalline silicon layer is hardly affected by external electric fields, and so a reliable transistor can be obtained.

Reliability

Some polycrystalline layers containing different amounts of oxygen were formed over the junction between the base and collector for passivation. These samples were subjected to reliability tests at 100° C with voltage of 350V DC for 1008 hours. After such tests, the $I_{CBO}$ was measured. It is deemed that the device which have $I_{CBO}$ more than 1 μA should be rejected. In these experiments, the percent of rejects using polycrystalline silicon layer containing 45 atomic percent were reduced to 1/7 of those as compared to those using SiO₂.

Especially, the percent of rejects using under 35 atomic percent is further reduced to about 1/20 of those using SiO₂. Since the coefficient of thermal expansion of the polycrystalline silicon layer is nearly equal to that of the semiconductor substrate, the contact between the polycrystalline layer and the semiconductor substrate is not affected by the thermal distortion and the PN junction is not thermally distorted which prevents deterioration of the characteristics of the transistors.

Although one embodiment of this invention has been described, it will be understood that various modifications are possible on the basis of the technical concept of this invention.

For example, the conversion of the conductivity type is possible. After the polycrystalline silicon is deposited on the semiconductor substrate, the polycrystalline silicon layer may be thermally treated at 900° C in order to obtain more stability. Oxygen atoms can be more uniformly distributed in the grains of polycrystalline silicon. The influence of external electrical fields can be reduced. The concentrations of oxygen may be locally different in the polycrystalline silicon layer within the range of 2 to 45 atomic percent.

Instead of N₂O, NO₂ or NO may be used to supply oxygen into the polycrystalline silicon layer. The flow rate of NO₂ or NO can be controlled to obtain the preferable concentration of oxygen. O₂ or H₂O vapor may be used instead of N₂O. N₂O, NO or NO₂ can be more easily controlled to obtain the preferable concentration of oxygen.

Moreover, instead of SiH₄, silicon halide, for example, SiCl₄ may be used. However, a higher growth temperature (1100° C) is required for SiCl₄. Accordingly, it is preferable to use SiH₄.

Naturally, this invention can be applied to a diode. A polycrystalline silicon layer is formed on the diode so as to cover the exposed portion of the PN junction of the diode. The breakdown voltage of the diode was measured where the ratio of N₂O/SiH₄ was equal to 1. The breakdown voltage depended on the depth of the P-type semiconductive region formed on the N-type semiconductor substrate with resistivity of 60 to 80 Ω cm. The breakdown voltage was 640 to 900V for a depth of 20 to 35 μ.

Since the polycrystalline silicon layer according to this invention is formed on reverse biased PN junctions, this invention can also be applied to a capacitor element of the PN junction type. Also this polycrystalline silicon layer can be applied to an insulating layer of MOS capacitor.

According to this invention, since the polycrystalline silicon layer contains 2 to 45 atomic percent oxygen, the electrical charge is not fixed in contrast to a SiO₂ layer of the conventional transistor. The breakdown voltage can be greatly increased. At the same time, the transistor according to this invention is not affected by external electrical field.

Moreover, the resistance of the polycrystalline silicon layer can be increased with 2 to 45 atomic percent oxygen, and the leakage current can be greatly reduced in comparison with a transistor using a pure polycrystalline silicon layer. Also, the $h_{FE}$ and noise characteristics can be greatly improved. Since the coefficient of thermal expansion of the polycrystalline silicon layer is nearly equal to that of the semiconductor single crystal layer, the contact between them does not deteriorate due to thermal distortion.

Although this invention has been described with respect to preferred embodiments, it is not to be so limited as changes and modifications can be made which are within the full intended scope as defined by the appended claims.

We claim as our invention:
1. A semiconductor device comprising:
   a semiconductor single crystal substrate;
   a polycrystalline silicon layer containing oxygen in the range of 2 to 45 atomic percent on and in substantially electrical contact with said substrate;
   said layer having a predetermined electric property such that the surface state of said substrate is substantially unaffected by an electric field across said layer.

2. A semiconductor device comprising:
   a semiconductor single crystal substrate;
   two semiconductor regions in said substrate forming a P-N junction therebetween ending at a surface of said substrate;
   a polycrystalline silicon layer containing oxygen in the range of 2 to 45 atomic percent on and in substantially electrical contact with said surface;
   said layer having a predetermined resistivity that relieves an electric field accompanying said junction when the latter is electrically biased.

3. A semiconductor device according to claim 1, further including a silicon dioxide layer on said polycrystalline layer.

4. A semiconductor device according to claim 1, in which electric charges moved into said layer from said substrate substantially compensate electric charges above said layer or said electric field which otherwise affect said surface state.

5. A semiconductor device according to claim 1, further including an electric conductor above said layer.

* * * * *